United States Patent [19]

Stewart et al.

[11] 4,030,000

[45] June 14, 1977

[54] CORNER SUPPORT MEMBER FOR SUBSCRIBER CARRIER CHANNEL UNIT ASSEMBLY

[75] Inventors: James R. Stewart, San Jose; Donald G. Tweed, Mountain View, both of Calif.

[73] Assignee: GTE Automatic Electric Laboratories Incorporated, Northlake, Ill.

[22] Filed: Mar. 1, 1976

[21] Appl. No.: 662,638

[52] U.S. Cl. .......................... 361/400; 174/138 D
[51] Int. Cl.$^2$ ..................... H05K 1/04; H05K 7/12
[58] Field of Search ............ 317/101 DH, 101 CC; 24/204; 248/221.4, 221.3; 174/138 D

[56] References Cited

FOREIGN PATENTS OR APPLICATIONS

| 1,230,475 | 12/1966 | Germany | 317/101 DH |
| 938,327 | 10/1963 | United Kingdom | 174/138 D |

Primary Examiner—David Smith, Jr.
Attorney, Agent, or Firm—Russell A. Cannon; Leonard R. Cool

[57] ABSTRACT

Support members are located near the corners of a pair of printed circuit cards for holding them together in a fixed, spaced-apart, adjacent and parallel relationship. Each card has a group of holes formed in the same pattern in each of the four corners thereof, at least one hole of each group extending all the way through the card. Each support member comprises a pair of plates that are joined together at a 90° angle along one edges thereof. Load-bearing pegs project from parallel, non-joined together edges of one plate. Flexible posts project from parallel, non-joined together edges of the other plate. An arm extends from each post proximate the end thereof that is spaced from the other plate and in a direction substantially parallel to said parallel edges of the other plate. A post and peg are located on adjacent edges of the plates such that they fit into corresponding holes in the same group thereof on a PC card, with the arm extending through a hole and snapping over the associated card to hold it in place. The pegs operate as load-bearing members when axial pressure is exerted on the plates to insert a card into or remove it from a shelf.

33 Claims, 6 Drawing Figures

U.S. Patent   June 14, 1977   4,030,000
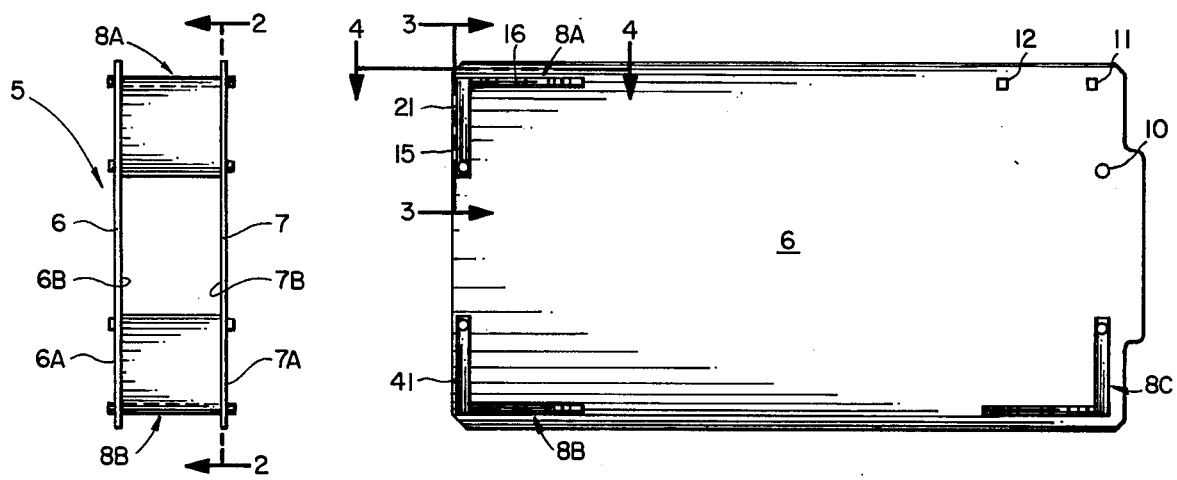
FIG. 1
FIG. 2
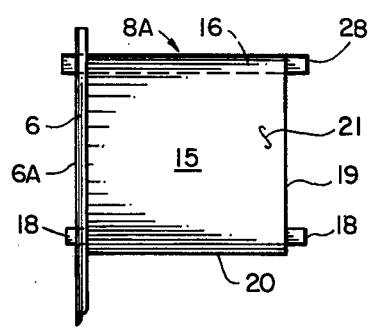
FIG. 3
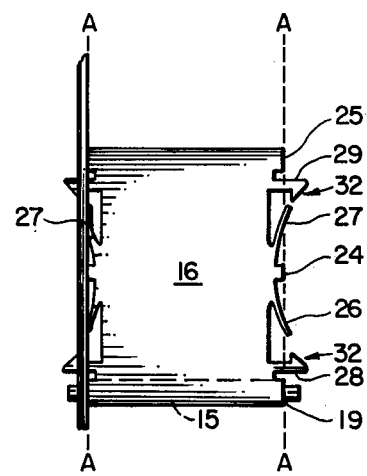
FIG. 4
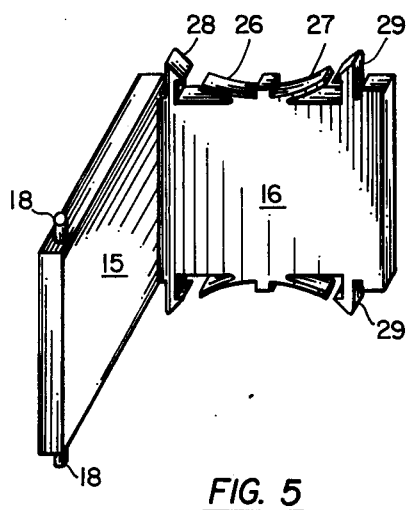
FIG. 5
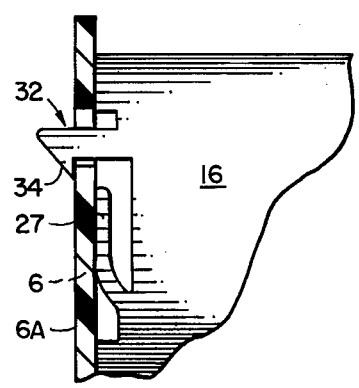
FIG. 6

CORNER SUPPORT MEMBER FOR SUBSCRIBER CARRIER CHANNEL UNIT ASSEMBLY

BACKGROUND OF THE INVENTION

This invention relates to mechanical assemblies and more particularly to a subscriber carrier channel unit assembly and corner support members thereof.

A subscriber carrier channel unit essentially comprises one or more printed circuit (PC) boards or cards having electrical elements and circuitry mounted thereon. In some channel units, a single PC card is mounted in the open side of a case which encloses the electrical circuit elements. In other channel units, two PC cards are placed next to each other, with electrical circuit elements located between the cards. The two cards are locked together in a parallel spaced-apart relationship in one channel unit by locating cylindrical metal rods or standoffs that are perpendicular to the cards at the four corners thereof. The metal standoffs are attached to the cards by screws. A plastic faceplate is attached to the front of the unit. It is time-consuming to assemble such a channel unit, which also may be distorted by longitudinal movement of the PC cards. In another channel unit, the two PC cards are attached together by cylindrical plastic standoffs manufactured by Richco Plastic Co. that have snap details on both ends thereof which fit into openings in the four corners of the PC cards. A plastic faceplate is also attached to the front of these other channel units. These plastic standoffs are relatively expensive, protrude a considerable distance beyond the cards, and allow them to wobble. In a further channel unit, a metal wrapper extends all the way around the perimeter of the two cards and is attached to the latter by tabs which are soldered to the cards. Such a channel unit is expensive.

DESCRIPTION OF DRAWING

This invention will be more fully understood from the following detailed description of a preferred embodiment thereof, reference being had to the following drawing in which:

FIG. 1 is a front view of a subscriber carrier channel unit assembly embodying this invention;

FIG. 2 is a side view of the subscriber carrier channel unit assembly in FIG. 1 taken along lines 2—2 with the PC card 12 and a corner support member removed therefrom;

FIG. 3 is an enlarged view of the corner support member 8A in FIG. 1 taken along lines 3—3;

FIG. 4 is an enlarged top view of the corner support member 8A in FIG. 2 taken along line 4—4;

FIG. 5 is a perspective view of the inside of a corner support member 8 in FIGS. 1 and 2; and FIG. 6 is a greatly enlarged view of a portion of the support member 8A in FIG. 4.

DESCRIPTION OF PREFERRED EMBODIMENTS

A channel unit assembly 5 embodying this invention is shown in FIGS. 1 and 2 and preferably comprises a pair of printed circuit (PC) boards or cards 6 and 7 and a corner support member 8 located in each of the four corners of the PC cards, only three corner support members 8 being shown in FIG. 2 for convenience of illustration. The physical structure of the two cards 6 and 7 is the same. The only difference between conventional PC cards and the cards 6 and 7 here is that the latter include a circular hole 10 and a pair of rectangularly shaped holes 11 and 12 which are located in each of the four corners thereof (see FIG. 2). In practice, the holes 11 and 12 may also be round for simplicity of manufacture. These holes 10 - 12 preferably extend through the PC cards. Electrical printed circuit patterns, plated through holes, and electrical components are not shown on the PC cards 6 and 7 in order to simplify the illustrations in FIGS. 1 and 2. In an electrically operative channel unit assembly 5, printed circuit patterns and electrical circuit components were formed on and attached to the sides 6A, 7A and 6B, 7B of the PC cards.

The four corner support members 8 in the channel unit 5 are identical. Enlarged front and top views of the support member 8A in the upper corner of this channel unit are illustrated in FIGS. 3 and 4, respectively. Each support member 8 comprises a pair of legs or plates 15 and 16 (see FIGS. 2 and 5) that are formed at an angle with respect to each other which is preferably a right angle. The plate 15 has a cylindrical peg 18 extending from each of the edges 19 thereof which contact the PC cards (see FIG. 3). The pegs 18 are formed proximate the end 20 of plate 15, which is spaced away from the other plate 16. These pegs 18 fit snugly into associated round holes 10 of the PC cards and are load-bearing elements for absorbing the forces produced when inserting a channel unit into or removing it from a shelf (not shown). The front 21 (see FIG. 2) of plate 15 is preferably flat for providing a smooth surface for a label or other markings to identify the particular channel unit.

The other plate 16 of each support member 8 has a pair of shoulders 24 and 25, a pair of cantilevered spring members 26 and 27, and a pair of posts 28 and 29 projecting from each side thereof. The exterior surfaces of each pair of shoulders 24 and 25 are aligned along a line A—A and are in a plane containing an edge 19 of plate 15. The spring members 26 and 27 are formed at an angle with respect to the edges of plate 16, the free ends thereof extending above the associated lines A—A. These spring members are made of a resilient material so that they exert a pressure or restoring force when they are deformed (see FIG. 6) from their normal position, which is shown on the right side of FIG. 4.

The posts 28 and 29 extend at right angles to the lines A—A and the edges of plate 16. An arm 32 projects from the free end of each of the posts 28 and 29 in a direction parallel to the plane containing a line A—A and associated edge 19. The top 34 of each arm 32 is tapered to provide a sliding surface when it comes in contact with a PC card (see FIG. 6.) The bottom of each arm 32 is spaced from an associated line A—A a distance that is only slightly greater than the thickness of the PC cards. The posts 28 and 29 are made of a resilient material such that under an appropriate pressure they will move in the direction of the length of plate 16 and return to their original position when such a pressure is released. They are dimensioned and positioned on the edges of plate 16 for insertion in associated holes 11 and 12 in the cards.

A channel unit is assembled by aligning the pegs 18 and posts 28 and 29 with associated holes 10, 11, and 12 in the PC cards. The posts 28 and 29 will bend under pressure to allow the arms 32 to pass through the holes 11 and 12 in the cards. The posts 28 and 29 then snap to their normal position with the arms 32 locking associated cards to the support members (see FIG. 6). The spring members 26 and 27 force the PC cards securely against the bottom surface of the arms 32 which then hold the assembly securely together. The plurality of edges of the plates 15 and 16 on the four support members prevent wobble of the two PC cards. The channel unit assembly is inserted into a shelf (not shown) by pressing on the front faces 21 and 41 of the corner supports 8A and 8B, respectively (see FIG. 2). The channel unit is removed from the shelf by pulling on the inner front surface of corner support member 8A. In each instance, the plurality of pegs 18 absorb the major force exerted on the channel unit assembly.

Although this invention is described here in relation to a preferred embodiment thereof, modifications and variations thereof will occur to those skilled in the art without departing from the spirit of this invention. By way of example, this invention may be employed for securing members other than a pair of printed circuit cards together in a spaced-apart relationship. In another alternate structure, the cards may be other than rectangularly shaped, and as few as two support members 8 may be attached to other than the corners of the cards. In an assembly with only two support members, they may be located near the top and bottom of the center of the cards or at the center of the front and back of the cards. In an assembly with three support members, two of them may be located at the back of the cards and one along the front, preferably the center, of the cards. Also, it is only necessary that the surfaces of the cards that contact edges of the support members be flat or in common planes. Further, the pegs 18 may have other than a circular cross section, e.g., they may be rectangularly shaped. The plates 15 and 16 may also be oriented at angles other than 90° or they may be curved. Although the plates 15 and 16 could be oriented to form any angle therebetween which is different from 0° and 180°, this angle is desirably between 45° and 135°. The included angle between plates 15 and 16 is preferably 90°, a little more or less. Additionally, the spring members 26 and 27 and the snap locking hooks of arms 28 and 29 may have shapes other than that illustrated here and still accomplish the same function. Although the pegs and posts have been described as being axially aligned, paired, and on different plates, a post and a peg may also be aligned, and posts and pegs may be located on edges of the same plate by appropriate orientation of the holes which then may not be identical on the two P.C. cards. Further, the pegs and posts need not be axially aligned. This invention is therefore defined in the following claims rather than the above detailed description of preferred embodiments thereof.

What is claimed is:

1. A member for holding a pair of printed circuit cards in a fixed, spaced-apart, adjacent and parallel relationship; groups of holes being formed in the same pattern at various locations in the faces of each card, at least one hole of each group extending all the way through the card; comprising:
   first and second plates being located adjacent to each other and being joined together along one edges thereof for forming an angle therebetween which is different from 0° and 180°; at least a portion of opposing edges of said plates that are adjacent the one joined-together edges thereof being adapted for contacting faces of the cards;
   a peg located on each of said opposing edges of said first plate;
   a flexible post located on each of said opposing edges of said second plate; and
   an arm extending from each of said posts proximate the end thereof that is spaced from said second plate in a direction substantially parallel to said portions of said opposing edges thereof;
   said post and peg on the same side of said plates being located thereon such that they fit into corresponding holes in the same group of holes in a card, said arm being spaced from the portion of the associated opposing edge of said second plate a distance causing said arm to snap over the associated card to securely hold it in position, the pegs operating as load-bearing members when axial pressure is exerted on a plate in a plane parallel to the cards.

2. The member according to claim 1 including spring means on at least one of said plates pressing against the face of a card proximate an opposing edge of said plates when the member is attached to a card.

3. The member according to claim 2 wherein said plates form an angle therebetween which is between 45° and 135°.

4. The member according to claim 3 wherein said spring means comprises a pair of leaf springs each of which is attached to an associated opposing edge of said second plate adjacent a post, said leaf springs exerting a pressure against faces of associated cards when the member is attached thereto.

5. The member according to claim 4 wherein the edge portions of said plates for contacting the same face of a card are in the same plane.

6. The member according to claim 2 wherein each of said plates is substantially planar, said plates forming an angle therebetween in the order of substantially 90°.

7. The member according to claim 6 including a second flexible post located on each of the opposing edges of said second plate and being spaced from said first post thereon, an arm extending from each of said second posts proximate the ends thereof that are spaced from said second plate in a direction substantially parallel to the opposing edges thereof, said second posts being located on said second plate for extending through another one of the holes in a card.

8. The member according to claim 7 wherein the said arms on said first and second posts extend in opposite directions.

9. The member according to claim 8 wherein said spring means comprises a pair of leaf springs extending from each of said opposite edges of said second plate a distance which extends beyond portions of these edges which are adapted for contacting faces of the cards.

10. The member according to claim 2 wherein said plates are curved.

11. An assembly comprising:
   a pair of members, surfaces of at least two portions of faces of each member being flat and in a common plane, a group of holes being formed in the same prescribed pattern in each of the flat portions of said members, at least one hole of each group extending all the way through said member; and
   a plurality of supports located between said members, each of said supports comprising: first and second plates being located adjacent to each other and being joined together along one edges thereof for forming an angle therebetween which is different from 0° and 180°; at least a portion of opposing edges of said plates that are adjacent the one joined-together edges thereof being adapted for contacting some of said portions of said members; a peg located on each of said opposing edges of said first plate; a flexible post located on each of said opposing edges of said second plate; and an arm extending from each of said posts proximate the end thereof that is spaced from said second plate in a direction substantially parallel to said portions of said opposing edges thereof; said post and peg on the same side of said plates being located thereon such that they fit into corresponding holes in the same group of holes in one of said members; said arms being spaced from associated edge portions of said second plate a distance for causing said arms to snap over a member when said member and support are joined together;

said supports being located with pegs and posts thereof in associated holes of associated groups of holes for holding said members together in a fixed, spaced-apart, adjacent relationship; said pegs operating as load-bearing elements when axial pressure is exerted on a plate.

12. The assembly according to claim 11 wherein each of said supports includes spring means on at least one of said plates proximate an opposing edge thereof and pressing against the faces of said members.

13. The assembly according to claim 12 wherein said plates form an angle therebetween which is between 45° and 135°.

14. The assembly according to claim 13 wherein each of said spring means comprises a pair of leaf springs, each of which is attached to an associated opposing edge of a second plate adjacent a post, said leaf spring exerting a pressure against faces of associated ones of said members.

15. The assembly according to claim 14 wherein said members are relatively flat and rectangularly shaped, a group of holes being located in each of the four corners of said members, a support being located adjacent each of the four corners of said members with pegs and posts thereof in associated holes in said members.

16. The assembly according to claim 12 wherein said plates are substantially planar and form an angle therebetween in the order of substantially 90°.

17. The assembly according to claim 16 wherein each support includes a second flexible post located on each of the opposing edges of said second plate and being spaced from said first post thereon, an arm extending from each of said second posts proximate the ends thereof spaced from said second plate in a direction substantially parallel to the opposing edge portions thereof, said second posts being located on said second plate for extending through another one of the holes in a member.

18. A subscriber carrier channel unit assembly comprising:

a pair of printed circuit cards having at least first and second groups of holes formed in the same pattern on each card, corresponding holes on said cards being aligned; and at least first and second support members located between said cards, each of said support members comprising: first and second plates being located adjacent to each other and being joined together along one edges thereof for forming an angle therebetween which is between 45° and 135°; at least a portion of pairs of opposing edges of said plates that are adjacent the one joined-together edges thereof being in parallel planes and adapted for contacting faces of said cards; axially aligned pegs located on said opposing edges of said first plate; axially aligned first flexible posts located on said opposing edges of said second plate; and an arm extending from each of said first posts proximate the end thereof that is spaced from said second plate in a direction substantially parallel to said opposing edge portions thereof; said first post and peg on the same sides of said plates being located thereon such that they fit into corresponding holes in the same group of holes in one of said cards, each of said arms being spaced from the associated adjacent edge portion of said second plate a distance causing said arm to snap over a card when said support members and said cards are joined together;

said first and second support members being located with pegs and first posts thereof in holes of said first and second groups of holes, respectively, for holding said cards together; said pegs operating as load-bearing members when axial pressure is exerted on a plate.

19. The assembly according to claim 18 wherein each of said support members includes spring means on at least one of said plates proximate at least one opposing edge thereof and pressing against the face of a card.

20. The assembly according to claim 19 wherein said spring means comprises a pair of leaf springs, each of which is attached to an associated opposing edge of a second plate adjacent a first post, said leaf springs exerting a pressure against faces of associated ones of said cards.

21. The assembly according to claim 18 wherein said cards have planar connectors formed on a face thereof adjacent to one edge thereof, at least one group of holes on each card and the associated support member being spaced away from said one edge of said cards.

22. The assembly according to claim 18 wherein said cards have planar connectors formed on a face thereof adjacent to one edge thereof, at least one group of holes on each card and the associated support member being adjacent the edge of said cards opposite said one edge thereof.

23. The assembly according to claim 18 wherein said cards are rectangularly shaped and have planar connectors formed on a face thereof adjacent to one edge thereof, said first and second groups of holes and associated support members being located adjacent said one edge and the edge opposite said one edge of said cards, respectively.

24. The assembly according to claim 23 including a group of holes in each of the four corners of said cards and a support member located adjacent each of the four corners of said cards with pegs and first posts thereof in associated holes of said cards.

25. The assembly according to claim 24 wherein each of said support members includes a pair of leaf springs, each of which is attached to an associated opposing edge of a second plate adjacent a first post, said leaf springs exerting pressure against faces of associated ones of said cards.

26. The assembly according to claim 25, each of said support members including a second flexible post located on each of the opposing edges of said second plate and being spaced from said first post thereon, an arm extending from each of said second posts proximate the ends thereof that are spaced from said portion of said second plate in a direction substantially parallel to the opposing edge portion thereof, said second posts being located on said second plate for extending through another one of the holes in a card; and a second pair of leaf springs extending from each of said opposite edges of said second plate a distance which extends beyond portions of these edges which are adapted for contacting faces of said cards.

27. A support for use in holding a printed circuit card and a member in a fixed, spaced-apart and adjacent relationship; surfaces of at least two portions of faces of said card and member being flat, in parallel planes and overlapping; the card having a first group of holes formed in a first prescribed pattern in at least two of the portions of one face thereof; the member having a second group of holes formed in a second prescribed pattern in at least two of the portions of one face thereof; at least one hole of each of the first and second groups thereof extending all the way through the associated card and member; comprising:
first and second plates being located adjacent to each other and being joined together along one edges thereof for forming an angle therebetween which is different from 0° and 180°; at least a portion of opposing edges of said plates that are adjacent the one joined-together edges thereof being in parallel planes and being adapted for contacting some of the portions of the card and member;
first and second rigid pegs;
first and second flexible posts;
said first peg and first post being located on first opposing edges of said plates that are on the same one side of the latter;
said second peg and second post being located on the other opposing edges of said plate that are on the same other side of the latter; and
first and second arms extending from said first and second posts proximate the ends thereof that are spaced from the associated opposing edges of said plates in a direction substantially parallel to said portions of said opposing edges of said plates;
said first post and first peg on the one side of said plates being located thereon in the first prescribed pattern such that they fit into corresponding holes in the same group of holes in the card; said second post and second peg on the other side of said plates being located thereon in the second prescribed pattern such that they fit into corresponding holes in the same group of holes in the member; said arms passing through the one hole of the associated group of holes and being spaced from said portions of the associated opposing edges of said plates a distance causing said arms to snap over the associated card and member to securely hold the latter in position.

28. The support according to claim 27 including spring means on at least one of said plates pressing against the faces of the card and member having portions thereof contacting portions of opposing edges of said plates when the support is attached to a card and member.

29. The support according to claim 27 wherein said plates form an angle therebetween which is between 45° and 135°.

30. The support according to claim 29 wherein said first post is aligned with one of said second post and second peg, said first peg being aligned with the other one of said second post and second peg.

31. The support according to claim 30 wherein said posts are aligned and said pegs are aligned, the first and second patterns on the card and member being the same patterns.

32. The support according to claim 29 wherein said first post and first peg are on opposing edges of the same plate.

33. The support according to claim 29 wherein said first post and first peg are on opposing edges of different plates.

* * * * *